(12) United States Patent
Seki

(10) Patent No.: US 6,924,754 B2
(45) Date of Patent: Aug. 2, 2005

(54) ITERATIVE DECODING METHOD AND ITERATIVE DECODING APPARATUS

(75) Inventor: Katsutoshi Seki, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 10/732,215

(22) Filed: Dec. 11, 2003

(65) Prior Publication Data

US 2004/0123214 A1 Jun. 24, 2004

(30) Foreign Application Priority Data

Dec. 13, 2002 (JP) ........................................ 2002-361586

(51) Int. Cl.[7] ............................................. H03M 13/00
(52) U.S. Cl. ........................................... 341/94; 714/755
(58) Field of Search ..................... 341/50, 94; 714/774, 714/784, 755

(56) References Cited

U.S. PATENT DOCUMENTS

| | | | |
|---|---|---|---|
| 6,151,441 A | * | 11/2000 | Kawamura et al. ........... 386/95 |
| 6,272,659 B1 | * | 8/2001 | Zook .......................... 714/774 |
| 6,332,206 B1 | * | 12/2001 | Nakatsuji et al. ........... 714/755 |
| 6,751,771 B2 | * | 6/2004 | Chuang et al. ............. 714/784 |

FOREIGN PATENT DOCUMENTS

| | | |
|---|---|---|
| JP | 60-116230 A | 6/1985 |
| JP | 6-244741 A | 9/1994 |
| JP | 10-107761 A | 4/1998 |
| JP | 10-190486 A | 7/1998 |
| JP | 2000-101447 A | 4/2000 |
| JP | 2002-009634 A | 1/2002 |

OTHER PUBLICATIONS

S.D. Bate, et al., "Error Control Techniques Applicable to HF Channels" IEEE Proceedings I. Solid–State & Electron Devices, Institution of Electrical Engineers, Stevenage, GB, vol. 136, No. 1, Part 1, Feb. 1, 1989, pp. 57–63.

* cited by examiner

Primary Examiner—Peguy JeanPierre
(74) Attorney, Agent, or Firm—Sughrue Mion, PLLC (57) ABSTRACT

A first stage inner code decoder performs a first error correction process for a plurality of inner code words. A first stage outer code decoder performs a second error correction process for a plurality of outer code words. A second stage inner code decoder performs a third error correction process for one or more inner code words whose number of errors has been decreased by the second error correction process and skips the third error correction process for one or more inner code words whose number of errors has not been decreased by the second error correcting process.

12 Claims, 10 Drawing Sheets

|     | PO$_1$ | PO$_2$ | PO$_3$ |   |   |
|-----|---|---|---|---|---|
| PI$_1$ |   | A |   |   |   |
| PI$_2$ | B |   |   |   | C |
| PI$_3$ | D |   | E |   |   |
| PI$_4$ |   | F | G |   |   |
| PI$_5$ | H |   |   |   | I |

FIG.10B

|     | PO$_1$ | PO$_2$ | PO$_3$ |   |   |
|-----|---|---|---|---|---|
| PI$_1$ |   |   |   |   |   |
| PI$_2$ | B |   |   |   | C |
| PI$_3$ | D |   | E |   |   |
| PI$_4$ |   | F | G |   |   |
| PI$_5$ | H |   |   |   | I |

FIG.10C

|     | PO$_1$ | PO$_2$ | PO$_3$ |   |   |
|-----|---|---|---|---|---|
| PI$_1$ |   |   |   |   |   |
| PI$_2$ | B |   |   |   | C |
| PI$_3$ | D |   | E |   |   |
| PI$_4$ |   |   | G |   |   |
| PI$_5$ | H |   |   |   | I |

UDI

FIG.10D

|     | PO$_1$ | PO$_2$ | PO$_3$ |   |   |
|-----|---|---|---|---|---|
| PI$_1$ |   |   |   |   |   |
| PI$_2$ | B |   |   |   | C |
| PI$_3$ | D |   | E |   |   |
| PI$_4$ |   |   |   |   |   |
| PI$_5$ | H |   |   |   | I |

UDO

FIG.10E

|     | PO$_1$ | PO$_2$ | PO$_3$ |   |   |
|-----|---|---|---|---|---|
| PI$_1$ |   |   |   |   |   |
| PI$_2$ | B |   |   |   | C |
| PI$_3$ | D |   |   |   |   |
| PI$_4$ |   |   |   |   |   |
| PI$_5$ | H |   |   |   | I |

ITERATIVE DECODING METHOD AND ITERATIVE DECODING APPARATUS

BACKGROUND OF THE INVENTION

1. Field of the Invention

The present invention relates to a iterative decoding method for a concatenated code or a product code, and an iterative decoding apparatus therefor.

2. Description of the Related Art

Figure 1:
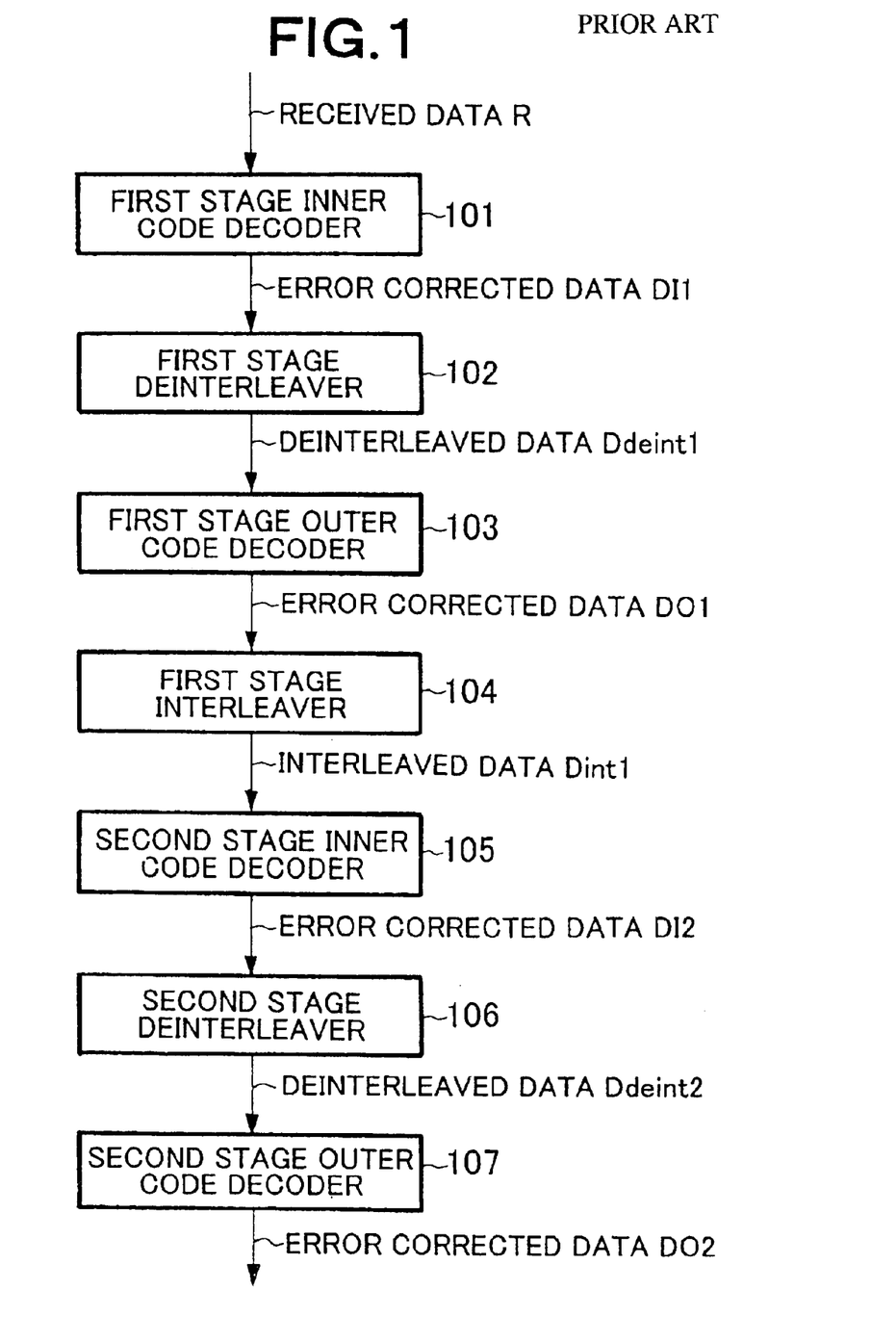
FIG. 1 is a schematic diagram showing a structure of an example of a iterative decoding circuit according to a related art reference.

A concatenated code is a code in which two different codes of an outer code and an inner code are concatenated. It is known that by alternately and iteratively performing a decoding process for an inner code and a decoding process for an outer code a plurality of times, an error correction ability of the concatenated code is improved. FIG. 1 is schematic diagram showing an example of a structure of a conventional iteratively decoding circuit.

In FIG. 1, received data R is decoded by a first stage decoder 101. The first stage decoder 101 corrects errors of the received data R. The resultant error corrected data DI1 is deinterleaved by a first stage deinterleaver 102. The resultant deinterleaved data Ddeint1 is decoded by a first stage outer code decoder 103. The first stage outer code decoder 103 corrects errors which were not corrected by the first stage decoder 101. The resultant error corrected data DO1 is interleaved by a first stage interleaver 104. The resultant interleaved data Dint1 is decoded by a second stage inner code decoder 105. The second stage inner code decoder 105 corrects errors which was not corrected by the first stage outer code decoder 103. The resultant error corrected data DI2 is deinterleaved by a second stage deinterleaver 106. The resultant deinterleaved data Ddeint2 is decoded by a second stage outer code decoder 107. The second stage stage inner code decoder 105. The resultant error corrected data DO2 is output.

In a iteratively decoding circuit, an inner code decoder iteratively performs an inner code decoding process for received data and an outer code decoder iteratively performs an outer code decoding process for the data decoded by the inner code decoder. The foregoing decoding circuit iteratively performs the inner code decoding process and the outer code decoding process two times each. The decoding circuit may iteratively perform those processes three or more times each.

Figure 2:
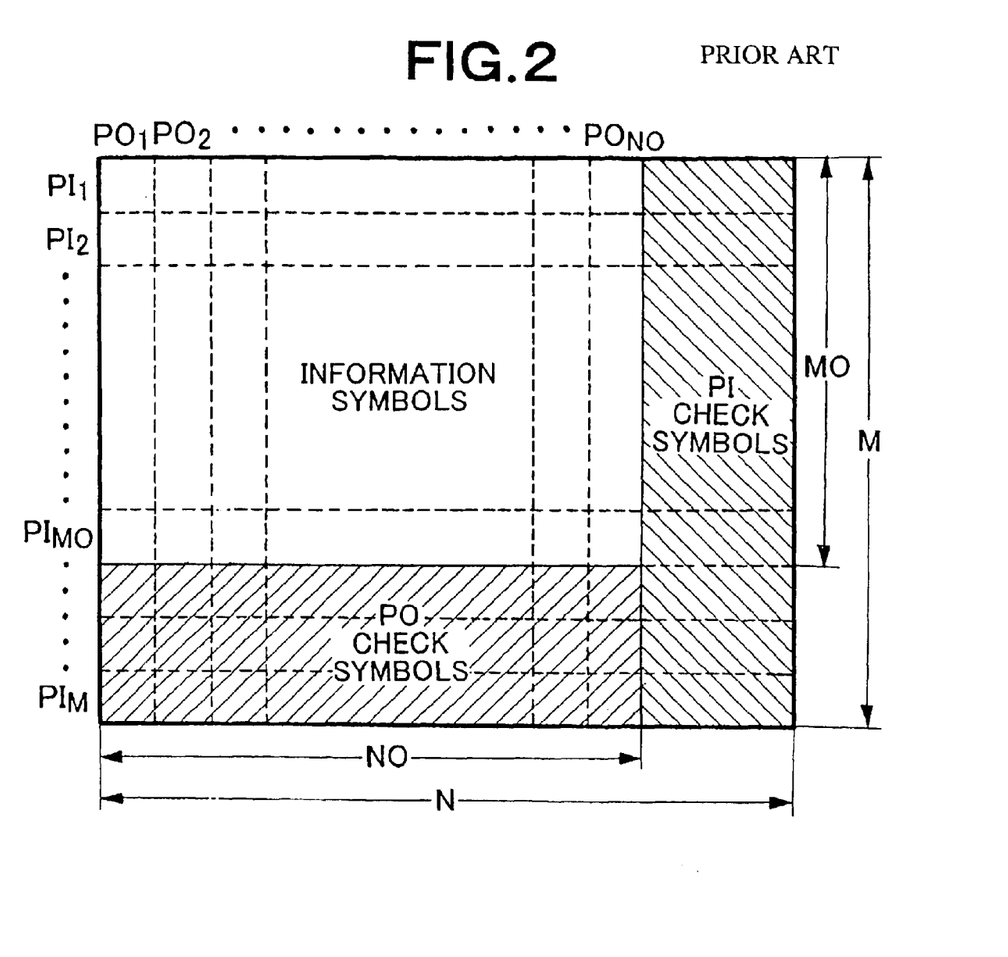
FIG. 2 is a schematic diagram showing a structure of an example of a product code.

Next, a product code that is one type of a concatenated code will be described. FIG. 2 is a schematic diagram showing an example of a product code. Referring to FIG. 2, check symbols for a product code are added to information symbols. In FIG. 2, encoded data is composed of M×N symbols (where M and N are positive integers). Of the M×N symbols, MO×NO symbols are information symbols. The portion excluding the information symbols is composed of check symbols.

A product code is a code in which two different codes are vertically and horizontally interleaved, respectively. In other words, a product code is composed of two error correction codes arranged in different directions of horizontal and vertical directions. In contrast, with the foregoing concatenated code, any interleaving method can be used.

In the example shown in FIG. 2, the product code is composed of outer code symbols $PO_1$ to $PO_{NO}$ with which information symbols are encoded in the vertical direction and inner code symbols $PI_1$ to $PI_M$ with which the information symbols are encoded in the horizontal direction. One column of the product code corresponds to one code word of the outer code PO, whereas one row of the product code corresponds to one code word of the inner code PI.

As an error correction code, a block code such as a Reed-Solomon (RS) code and a Bose-Chaudhuri-Hocquenghem (BCH) code is used. The product code decoder performs a decoding process (an error correcting process) by iteratively correcting errors of data encoded with a block in two directions.

Next, a conventional concatenated code decoding method will be described with an example of a decoding circuit for a product code that is one type of a concatenated code.

Figure 3:
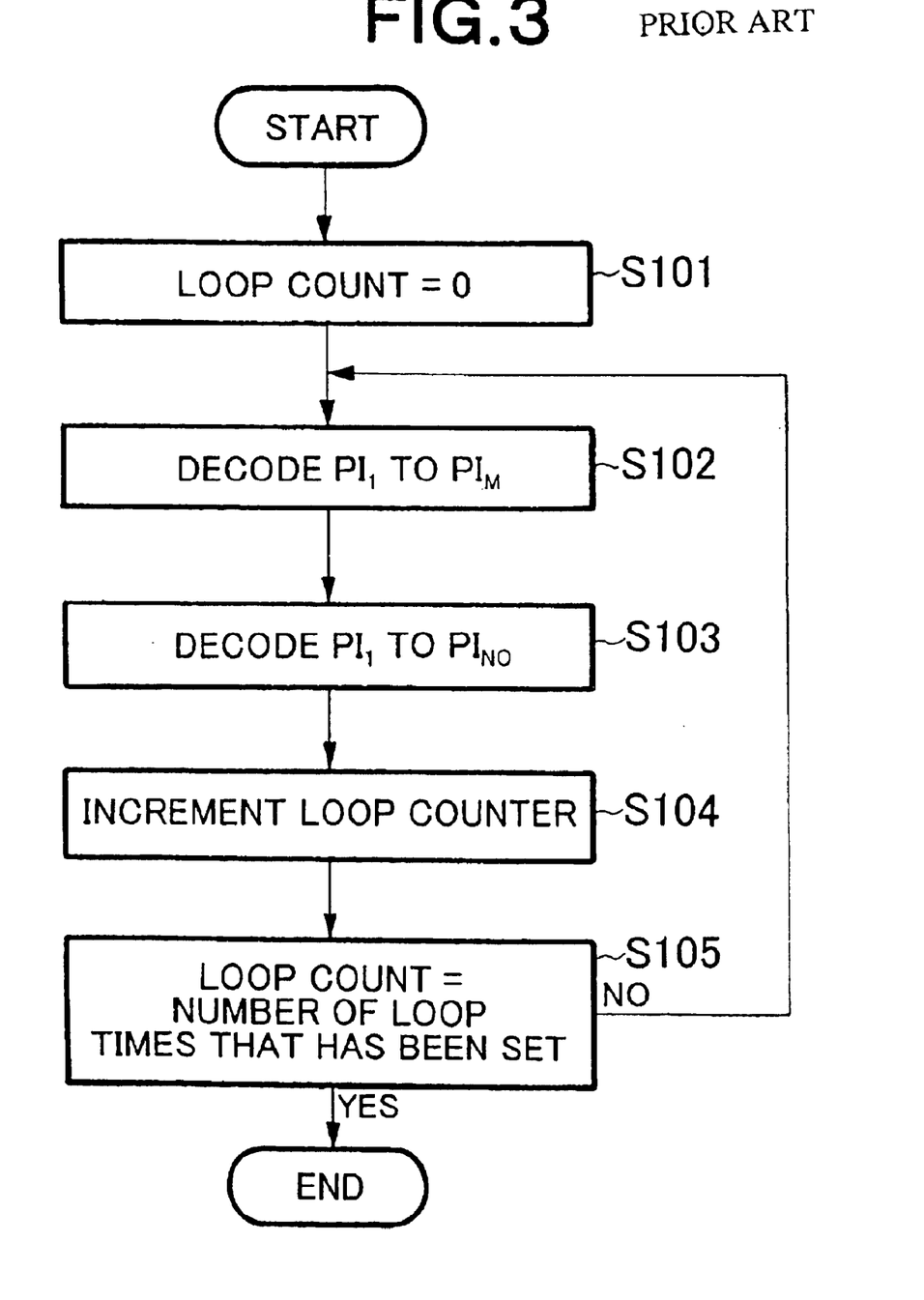
FIG. 3 is a flow chart showing an example of a product code decoding process according to the related art reference.

FIG. 3 is a flow chart showing an example of a conventional iteratively product code decoding process. Referring to FIG. 3, first of all, the number of loop times (loop count) is reset to zero (at step S101). Thereafter, errors of code words of the inner code PI sequence are successively corrected (at step S102). Thereafter, errors of code words of the outer code PO sequence are successively corrected (at step S103). Thereafter, the loop counter is incremented by one (at step S104). Thereafter, it is determined whether or not the value of the loop counter matches the predetermined number of loop times (at step S105). If the value of the loop counter does not match the predetermined number of loop times (determined result is NO), then steps S102 to S104 are iterated. In contrast, if the value of the loop counter matches the predetermined number of loop times (determined result is YES), then the decoding process is completed.

In such a manner, errors of code words of the inner code PI sequence and errors of code words of the outer code PO sequence are iteratively corrected a plurality of times. This is because the maximum number of error symbols which can be corrected in the error correcting process for each code word is limited. Error symbols are corrected in the range which does not exceed the number of correctable symbols. By iteratively performing the error correcting process for each sequence, error symbols of information symbols are gradually corrected. It is known that as the number of times the error correcting process is iteratively performed is large, the number of error symbols which can be corrected becomes large.

Figure 4:
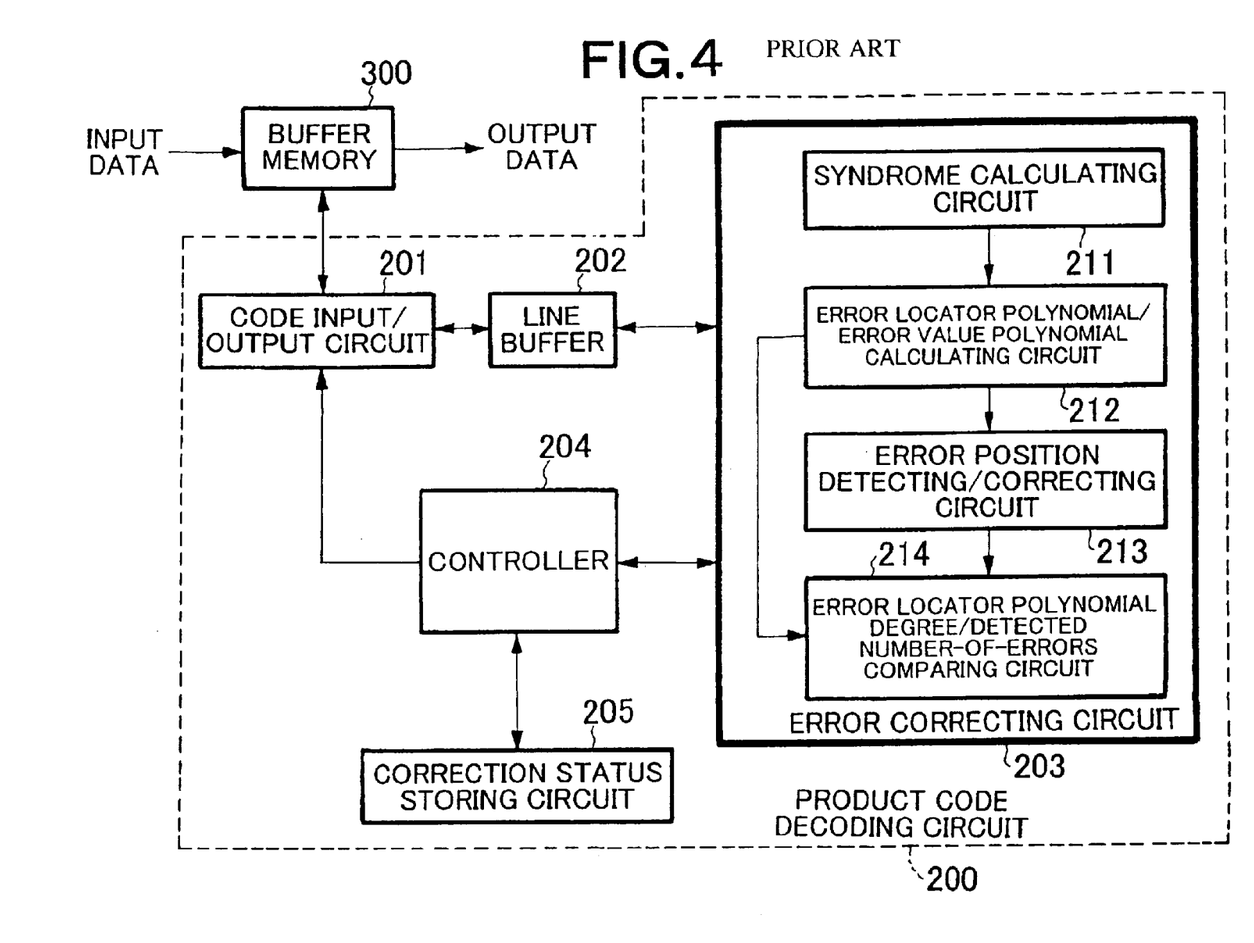
FIG. 4 is a schematic diagram showing a structure of a product code decoding circuit (200) described in the patent document 1.

An example of such a product code decoding circuit is described in Japanese Patent Laid-Open Publication No. 2000-101447 (paragraphs [0026] to [0030], FIG. 1) (hereinafter referred to as patent document 1). FIG. 4 is a schematic diagram showing a structure of a product code decoding circuit 200 described in the parent document 1. Referring to FIG. 4, the product code decoding circuit 200 comprises a code input/output circuit 201, a line buffer 202, an error correcting circuit 203, a controller 204, and a correction status storing circuit 205.

In addition, the error correcting circuit 203 comprises a syndrome calculating circuit 211, an error locator polynomial/error value polynomial calculating circuit 212, an error position detecting/correcting circuit 213, an error locator polynomial degree/detected number-of-errors comparing circuit 214. In FIG. 4, reference numeral 300 represents a buffer memory which is an external unit which transmits and receives data to and from the code input/output circuit 201.

The product code decoding circuit 200 corrects error symbols of each code word of each of the PI sequence (inner code) and PO sequence (outer code). The correction status storing circuit 205 stores results of corrected error symbols. The controller 204 references a correction flag stored in the correction status storing circuit 205 so as to perform the error correcting process for code words which have error symbols and skip the error correcting process for code words which do not have error symbols and code words whose error symbols have been already corrected. As a result, the number of code words subjected to the correcting process is decreased and the calculation amount of the error correcting process is decreased.

Figure 5:
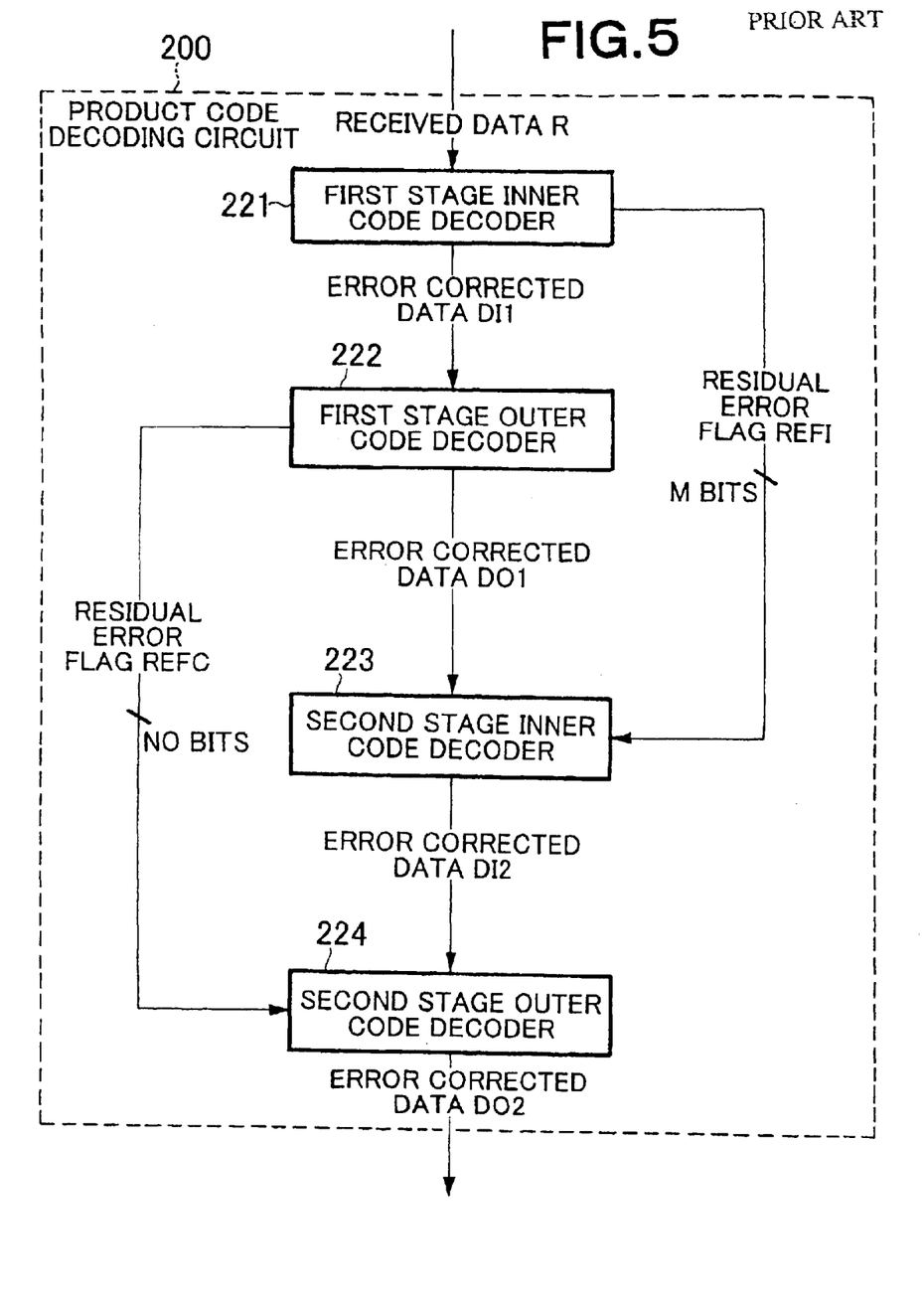
FIG. 5 is a schematic diagram showing a structure of the product code decoding circuit (200)
Figure 6:
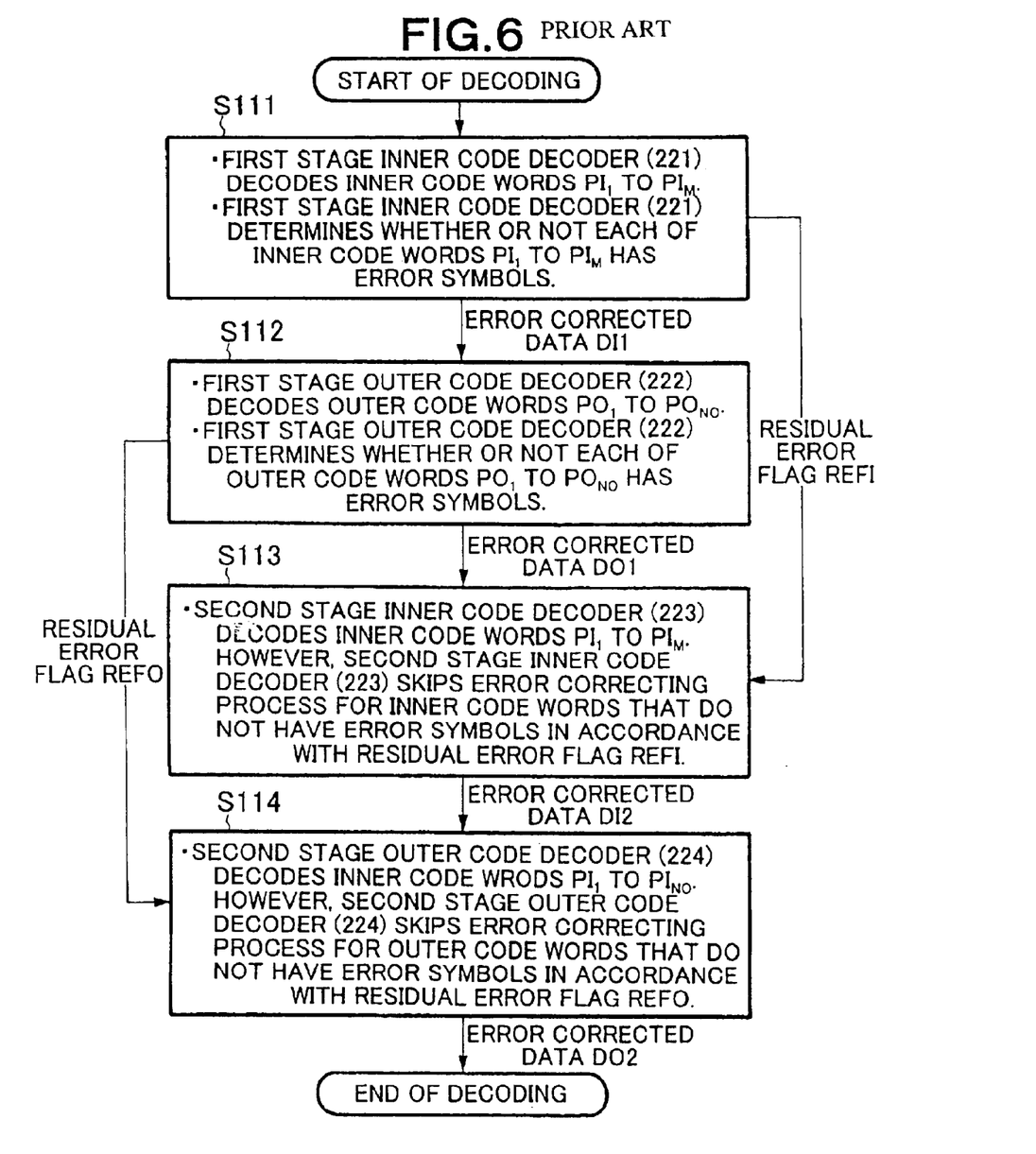
FIG. 6 is a flow chart showing an operation of the product code decoding circuit (200)

Next, assuming that the number of iterative times of the error correcting process of the product code decoding circuit 200 is two, with reference to FIG. 5 and FIG. 6, an operation of the circuit will be described in brief. FIG. 5 is a schematic diagram showing a structure of the product code decoding circuit 200. FIG. 6 is a flow chart showing the operation of the product code decoding circuit 200. Referring to FIG. 5, the product code decoding circuit 200 comprises a first stage inner code decoder 221, a first stage outer code decoder 222, a second stage inner code decoder 223, and a second stage outer code decoder 224.

The first stage inner code decoder 221, the first stage outer code decoder 222, the second stage inner code decoder 223, and the second stage outer code decoder 224 shown in FIG. 5 are disposed in the error correcting circuit 203 shown in FIG. 4. These units are controlled by the controller 204 shown in FIG. 4. A residual error flag which will be described later is stored in the correction status storing circuit 205 shown in FIG. 4.

The first stage inner code decoder 221 divides the received data R into inner code words $PI_1$ to $PI_M$. If the number of error symbols per code word does not exceed the error correctable range, then the first stage inner code decoder 221 performs the error correcting process for the error symbols and outputs the resultant error corrected data DI1 to the next stage. In addition, the first stage inner code decoder 221 determines whether or not the error correcting process has failed for error symbols of each of the inner code words $PI_1$ to $PI_M$ because the number of error symbols exceeds the error correctable range and outputs a residual error flag REFI which represents whether the error correcting process has failed to the second stage inner code decoder 223 (at step S111).

The first stage outer code decoder 222 divides the error corrected data DI1 into outer code words $PO_1$ to $PO_{NO}$. If the number of error symbols per code word does not exceed the error correctable range, then the first stage outer code decoder 222 performs the error correcting process for error symbols of each inner code word and outputs the resultant error corrected data DO1 to the next stage. In addition, the first stage outer code decoder 222 determines whether or not the error correcting process has failed for error symbols of each of the outer code words $PO_1$ to $PO_{NO}$ because the number of error symbols exceeds the error correctable range and outputs a residual error flag REFO which represents whether or not the error correcting process has failed to the second stage outer code decoder 224 (at step S112).

The second stage inner code decoder 223 divides the error corrected data DO1 into inner code words $PI_1$ to $PI_M$. If the number of error symbols per code word does not exceed the error correctable range, then the second stage inner code decoder 223 performs the error correcting process for error symbols of each of the inner code words $PI_1$ to $PI_M$ and outputs the resultant error corrected data DI2 to the next stage. However, the second stage inner code decoder 223 skips the error correcting process for each inner code word which does not have error symbols in accordance with the residual error flag REFI (at step S113). In other words, the second stage inner code decoder 223 performs the error correcting process for all inner code words for which the residual error flag REFI is set. However, the second stage inner code decoder 223 does not perform the error correcting process for all inner code words for which the residual error flag REFI is reset. Thus, the second stage inner code decoder 223 determines whether or not to perform the error correcting process for each code word depending on whether or not the residual error flag REFI is set therefor.

The second stage outer code decoder 224 separates the error corrected data DI2 into outer code words $PO_1$ to $PO_{NO}$. When the number of error symbols per each code word does not exceed the error correctable range, the second stage outer code decoder 224 performs the error correcting process for error symbols of each code word and outputs the resultant error corrected data DO2. However, the second stage outer code decoder 224 skips the error correcting process for each outer code word which does not have error symbols in accordance with the residual error flag REFO (at step S114). In other words, the second stage outer code decoder 224 performs the error correcting process for all outer code words for which the residual error flag REFO is set. In contrast, the second stage outer code decoder 224 does not perform the error correcting process for all outer code words for which the residual error flag REFO is reset. Thus, the second stage outer code decoder 224 determines whether or not to perform the error correcting process for each outer code depending on whether or not the residual error flag REFO is set therefor.

According to the related art reference, by referencing the residual error flags REFI and the REFO, the error correcting process is performed for only code words which have error symbols. However, the error correcting process is skipped for code words which do not have error symbols and code words for which the error correcting process has been already performed. Thus, the number of code words for which the error correcting process is performed is decreased and the calculation amount for the error correcting process is decreased.

In consideration of inner code words, the error correcting process can be skipped for the following two types thereof.

(1) an inner code word whose error symbols have been corrected by immediately preceding stage inner code decoding process or former decoding process and an inner code word who has no error symbols from the first.

(2) an inner code word which had error symbols which exceed the error correctable range for the immediately preceding stage inner code decoding process, and whose number of errors was not decreased by the immediately preceding stage inner code decoding process. Since this inner code word has error symbols which exceed the error correctable range, it is meaningless to perform the decoding process for this inner code word.

Likewise, in consideration of outer code words, the error correcting process can be skipped for the following two types thereof.

(3) an outer code word whose error symbols have been corrected by immediately preceding stage outer code decoding process or former decoding process and an outer code word who has no error symbols from the first.

(4) an outer code word which had error symbols which exceed the error correctable range for the immediately preceding stage outer code decoding process, and whose number of errors was not decreased by the immediately preceding stage outer code decoding process. Since this outer code word has error symbols which exceed the error correctable range, it is meaningless to perform the decoding process for the outer code word.

However, according to the related art reference, since the error correcting process is skipped for only the foregoing cases (1) and (3), the effect that the calculation amount is decreased is low.

SUMMARY OF THE INVENTION

Therefore, an object of the present invention is to provide a iteratively decoding method which allows the error correcting process to be skipped for all the cases (1), (2), (3), and (4) and the calculation amount to be remarkably decreased in comparison with the related art reference, and a iteratively decoding apparatus thereof.

According to the present invention, there is provided a iteratively decoding method, comprising the steps of: performing a first error correction process for a plurality of first code words; performing a second error correction process for a plurality of second code words; and performing a third error correction process for one or more first code words whose number of errors has been decreased by the second error correction process and skipping the third error correction process for one or more first code words whose number of errors has not been decreased by the second error correcting process.

The iteratively decoding method, may further comprises: performing a fourth error correction process for one or more second code words whose number of errors has been decreased by the third error correction process and skipping the fourth error correction process for one or more second code words whose number of errors has not been decreased by the third error correcting process.

In the iterative decoding method, the first code words may be inner code words, and the second code words may be outer code words.

In the iterative decoding method the first code words may be outer code words, and the second code words may be inner code words.

In the iterative decoding process according to the present invention, the calculation amount can be remarkably decreased in comparison with that of the related art reference. The effect that the calculation amount is decreased becomes high as the error rate of received data becomes high.

We consider a case where the decoding process is iteratively performed N times for data. Errors which exceeds the error correction range for all the inner codes and for all the outer codes are added to the data. In this case, the decoding circuit according to the related art reference tries to perform the error correcting process for each code word as long as it has error symbols. Thus, the decoding circuit performs the error correcting process N times. The decoding circuit does not skip the error correcting process. In contrast, on the first stage, the decoding circuit according to the present invention tries to perform the error correcting process for the inner code words and outer code words. However, on the second and later stages, there are no code words which have been updated on the immediately preceding stage. Therefore, according to the present invention, the decoding circuit skips the error correcting process. Thus, the calculation amount of the decoding circuit according to the present invention becomes 1/N of that of the decoding circuit according to the related art reference.

These and other objects, features and advantages of the present invention will become more apparent in light of the following detailed description of the best mode embodiment thereof, as illustrated in the accompanying drawings.

DESCRIPTION OF PREFERRED EMBODIMENTS

Next, with reference to the accompanying drawings, embodiments of the present invention will be described.

(First Embodiment)

Figure 7:
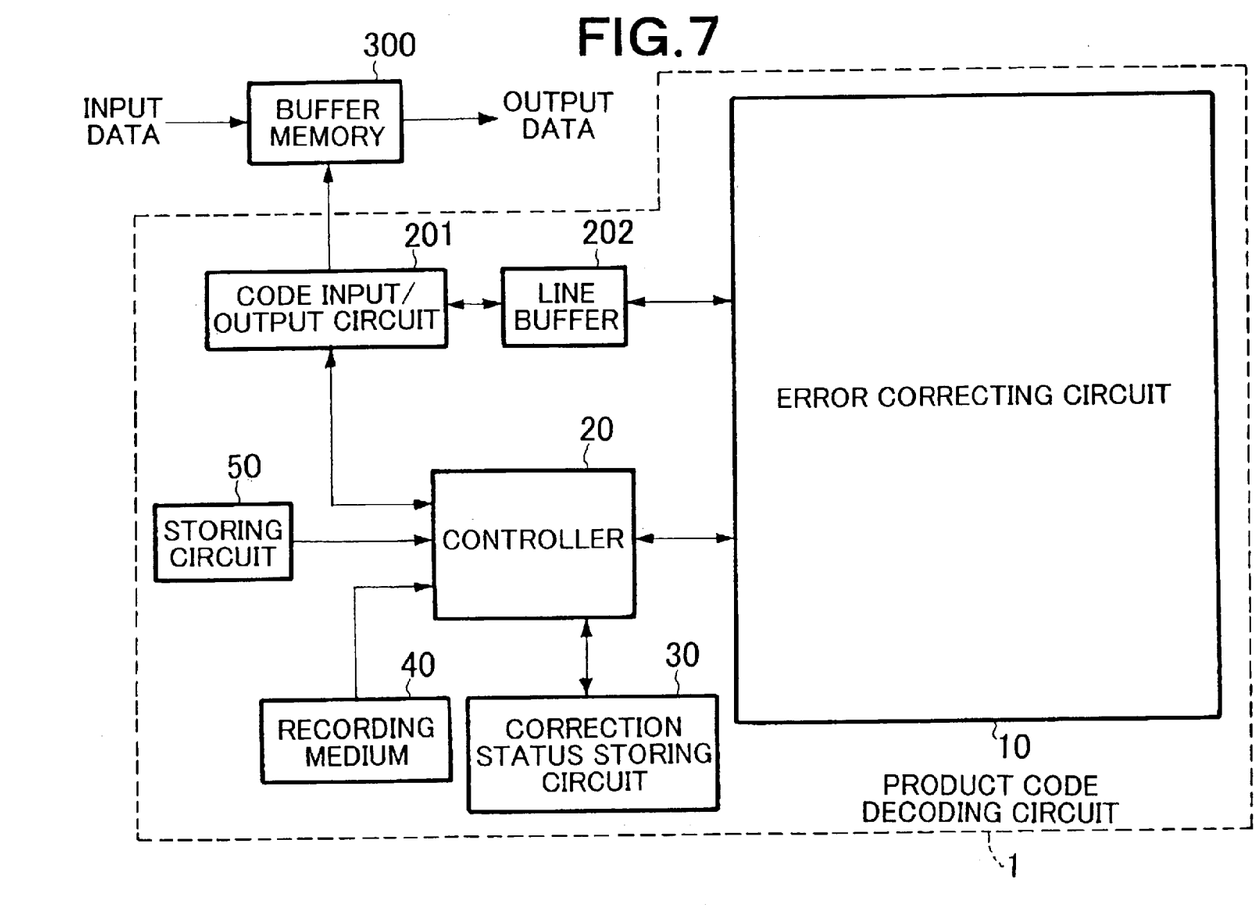
FIG. 7 is a schematic diagram showing an overall structure of an example of a product code decoding circuit according to the present invention.

First of all, a first embodiment of the present invention will be described. The first embodiment is directed to a product code decoding circuit. FIG. 7 is a schematic diagram showing an overall structure of an example of the product code decoding circuit according to the present invention. To prevent redundancy, in FIG. 7, similar portions to those of the structure of the related art reference (see FIG. 4) will be denoted by the similar reference numerals and their description will be omitted.

Referring to FIG. 7, reference numeral 1 represents the product code decoding circuit. The product code decoding circuit 1 comprises a code input/output circuit 201, a line buffer 202, an error correcting circuit 10, a controller 20, a correction status storing circuit 30, a recording medium 40, and a storing circuit 50. Reference numeral 300 represents a buffer memory which is an external unit. The buffer memory 300 transmits and receives data to and from the code input/output circuit 201.

The controller 20 controls the error correcting circuit 10. The correction status storing circuit 30 stores an update flag which will be described later. The recording medium 40 stores a program which will be described later. The storing circuit 50 stores a program which is read from the recording medium 40.

The error correcting circuit 10 corrects errors of input data which has been input through the buffer memory 300, the code input/output circuit 201, and the line buffer 202 and outputs the corrected data through the line buffer 202, the code input/output circuit 201, and the buffer memory 300. The controller 20 references the update flag stored in the correction status storing circuit 30 and determines whether to cause the error correcting circuit 10 to perform the error correcting process or to skip it. The controller 20 performs the determination on the basis of the program stored in the recording medium 40.

Figure 8:
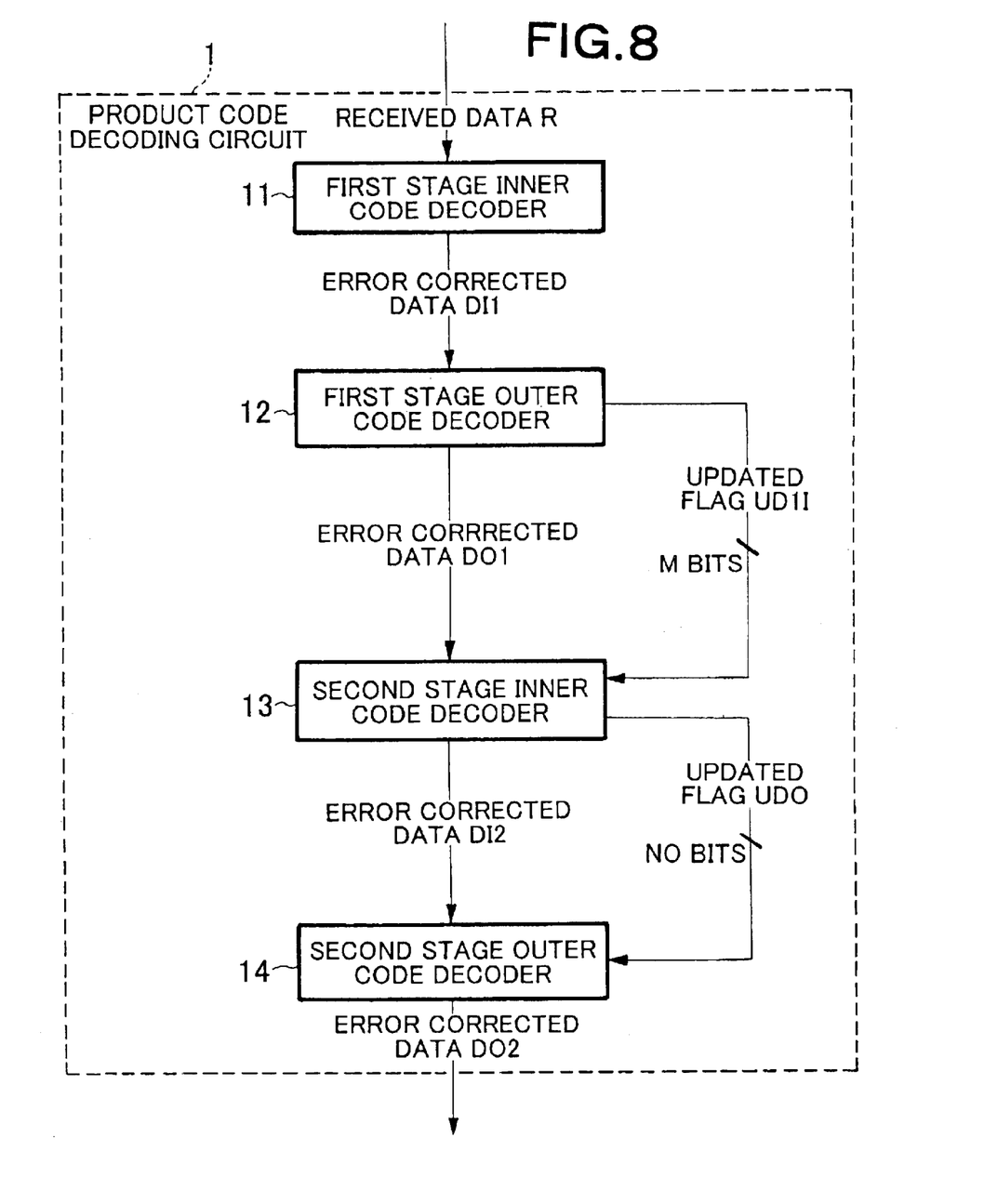
FIG. 8 is a schematic diagram showing a structure of a part of the product code decoding circuit according to the present invention.

Next, an operation of the product code decoding circuit 1 will be described. For example, the product code decoding circuit 1 iteratively performs an inner code decoding process and an outer code decoding process two times each. FIG. 8 is a schematic diagram showing a structure of a part of the product code decoding circuit according to the present invention. Referring to FIG. 2, the product code decoding circuit 1 comprises a first stage inner code decoder 11, a first stage outer code decoder 12, a second stage inner code decoder 13, and a second stage outer code decoder 14. These decoders 11 to 14 are disposed in the error correcting circuit 10 shown in FIG. 7.

Figure 9:
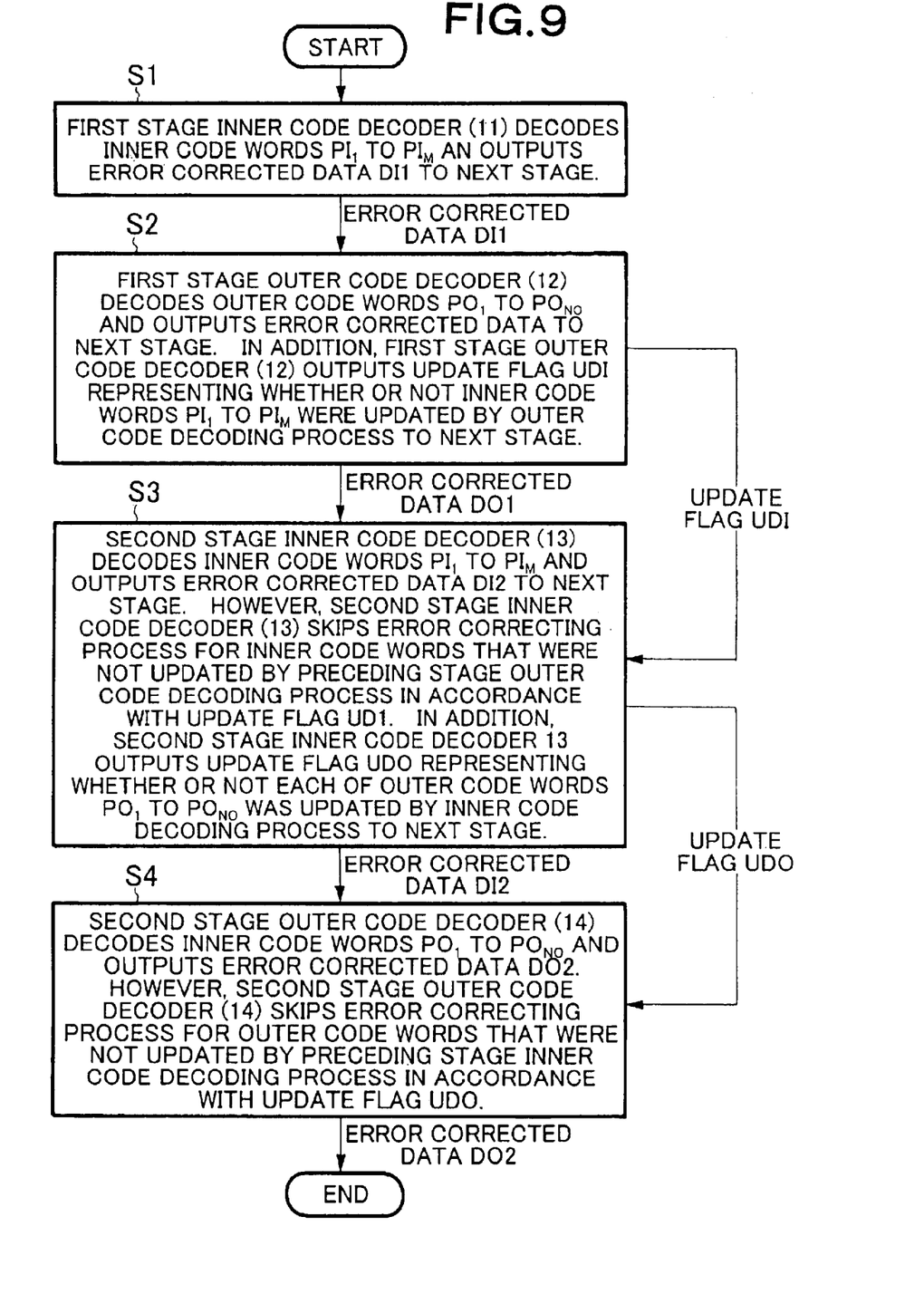
FIG. 9 is a flow chart showing an operation of a product code decoding circuit (1) according to the present invention.

FIG. 9 is a flow chart showing the operation of the product code decoding circuit 1 according to the present invention. In the example, it is assumed that the number of iterative times of the product code decoding circuit 1 is two. Alternatively, the present invention can be applied to the case that the number of iterative times of the product code decoding circuit 1 is three or more.

The first stage inner code decoder 11 divides received data R into inner code words $PI_1$ to $PI_M$. If the number of error symbols per code word does not exceed the error correction range, then the first stage inner code decoder 11 performs the error correcting process for the inner code words $PI_1$ to $PI_M$ and outputs the resultant error corrected data DI1 to the first stage outer code decoder 12 disposed on the next stage thereof (at step S1).

The first stage outer code decoder 12 divides the error corrected data DI1 received from the first stage inner code decoder 11 into outer code words $PO_1$ to $PO_{NO}$. If the number of error symbols per code word does not exceed the error correctable range, then the first stage outer code decoder 12 performs the error correcting process for the outer code words $PO_1$ to $PO_{NO}$ and outputs the resultant error corrected data DO1 to the second stage inner code decoder 13 disposed on the next stage thereof. In addition, the first stage outer code decoder 12 determines whether or not the number of error symbols of each of the inner code words $PI_1$ to $PI_M$ was decreased by the outer code decoding process and outputs the resultant update flag UDI to the second stage inner code decoder 13 disposed on the next stage thereof (at step S2). The update flag UDI is composed of M bits which represent whether or not the number of error symbols of each of the inner code words was decreased by the outer code decoding process. The first stage outer code decoder 12 outputs the update flag UDI to the second stage inner code decoder 13 disposed on the next stage thereof.

The second stage inner code decoder 13 divides the error corrected data DO1 into inner code words $PI_1$ to $PI_M$. If the number of error symbols per code word does not exceed the error correctable range, then the second stage inner code decoder 13 performs the error correcting process for the inner code words and outputs the resultant error corrected data DI2 to the next stage. However, the second stage inner code decoder 13 skips the error correcting process for each inner code word whose number of error symbols was not decreased by the first stage outer code decoder 12 in accordance with the update flag UDI. An inner code word whose number of error symbols was not decreased by the first stage outer code decoder 12 includes an inner code word which does not have error symbols when the inner code word was output from the first stage inner code decoder 11 and an inner code word which does not have error symbols that were corrected by the first stage outer code decoder 12. On the other hand, an inner code word whose number of error symbols was decreased by the first stage outer code decoder 12 is an inner code word which has error symbols which were corrected by the first stage outer code decoder 12.

The second stage inner code decoder 13 determines whether or not the number of error symbols of each of the outer code words $PO_1$ to $PO_{NO}$ was decreased by the inner code decoding process and outputs an update flag UDO to the second stage outer code decoder 14 (at step S3). The update flag UDO is composed of NO bits which represent whether or not the number of error symbols of the outer code words were decreased by the inner code decoding process. The second stage inner code decoder 13 outputs the update flag UDO to the second stage outer code decoder 14 disposed on the next stage thereof.

The second stage outer code decoder 14 divides the error corrected data DI2 into outer code words $PO_1$ to $PO_{NO}$. If the number of error symbols per code word does not exceed the error correctable range, then the second stage outer code decoder 14 performs the error correcting process for the outer code words $PO_1$ to $PO_{NO}$ and outputs the resultant error corrected data DO2. However, the second stage outer code decoder 14 skips the error correcting process for each outer code word whose number of error symbols was not decreased by the second stage inner code decoder 13 (at step S4). An outer code word whose number of error symbols was not decreased by the second stage inner code decoder 13 includes an outer code word which has no error symbols when the outer code word was output from the first stage outer code decoder 12 and an outer code word which does not have error symbols corrected by the second stage inner code decoder 13. On the other hand, an inner code whose number of error symbols was decreased by the second stage inner code decoder 13 is an outer code which has error symbols which were corrected by the second stage inner code decoder 13.

Next, a concrete example of the foregoing error correcting process will be described. FIG. 10A to FIG. 10E are schematic diagrams showing a concrete example of the error correcting process. It is assumed that there are five rows of inner code words PI1 to PI5 and three columns of outer code words PO1 to PO3. Among them, 3×3 symbols are information symbols. A portion excluding the information symbols is composed of check symbols.

Figure 10A:
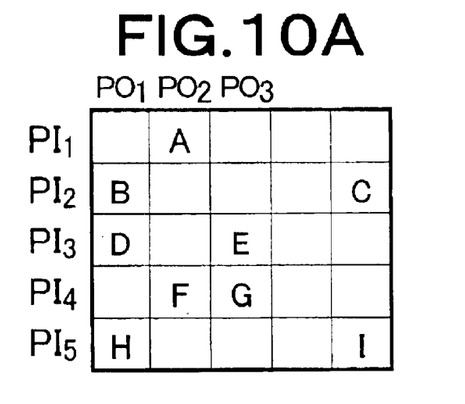
FIG. 10A to FIG. 10E are schematic diagrams showing a concrete example of the error correcting process.

Assuming that up to one symbol is an error correctable code, the case that error symbols are present in (5 row×5 column) product code words will be described. Now, positions of symbols are represented by (row, column). As shown in FIG. 10A, it is assumed that error symbols are present in (1, 2), (2, 1), (2, 5), (3, 1), (3, 3), (4, 2), (4, 3), (5, 1), and (5, 5). These error symbols are denoted by A to I as shown in FIG. 10A.

Figure 10B:
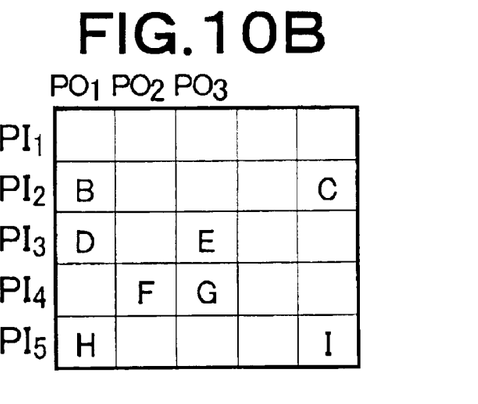

Step S1: As shown in FIG. 10B, the first stage inner code decoder 11 corrects error symbols on the row PI1 (thus, the error symbol A shown in FIG. 4A is corrected). However, on each of the rows PI2 to PI5, since the number of error symbols exceeds the error correctable range, the first stage inner code decoder 11 does not correct these error symbols. In other words, since there are two error symbols B and C on the row PI2, two error symbols D and E on the row PI3, two error symbols F and G on the row PI4, and two error symbols H and I on the row PI5.

Figure 10C:
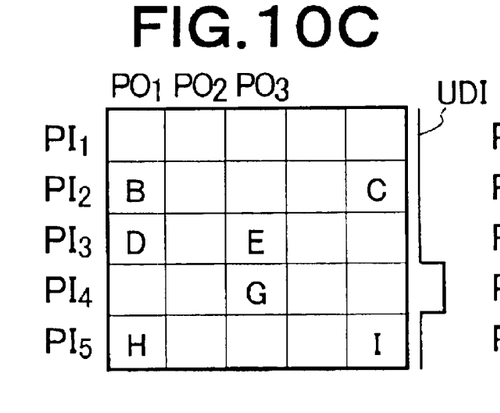

Step S2: Since the error symbol A has been corrected at step S1, there is only one error symbol F on the column PO2. Thus, the first stage outer code decoder 12 corrects the error symbol F on the column PO2. On the other hand, since there are error symbols which exceed the error correctable range on each of the columns PO1 and PO3, the first stage outer code decoder 12 does not correct these error symbols. In other words, there are three error symbols B, D, and H on the column PO1 and two error symbols E and G on the column PO3.

Thus, the update flag UDI transmitted from the first stage outer code decoder 12 to the second stage inner code decoder 13 represents that the rows PI1, PI2, PI3, PI4, and PI5 are "not updated", "not updated", "not updated", "updated", and "not updated", respectively, because an error symbol on the row PI1 was corrected at step S1, the number of error symbols on each of the rows PI2, PI3, and PI5 was not decreased, and the number of error symbols on the row PI4 was decreased.

Figure 10D:
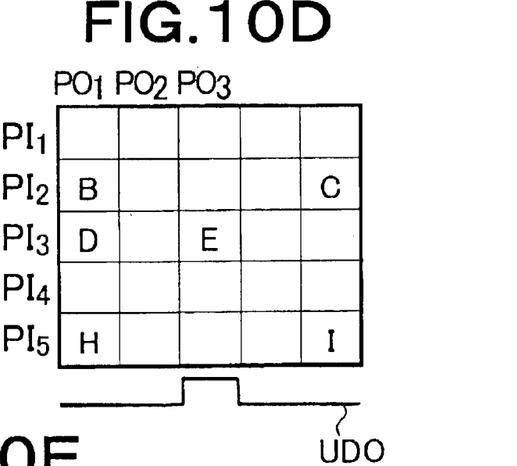

Step S3: The second stage inner code decoder 13 references the update flag UDI received from the first stage outer code decoder 12. Since the update flag UDI represents that the rows PI1, PI2, PI3, and PI5 are "not updated", the second stage inner code decoder 13 skips the error correcting process for error symbols on these rows. In contrast, the send stage inner code decoder according to the related art reference skips the error correcting process for error symbols on only the row PI1. In other words, the number of error symbols which are skipped according to the related art reference is one, whereas the number of error symbols which are skipped according to the present invention is four. The second stage inner code decoder 13 tries to correct error symbols on the row PI4 which is "updated" in the update flag UDI. Since there is only one error symbol G on the row PI4, the second stage inner code decoder 13 corrects the error symbol G.

Thus, the update flag UDO transmitted from the second stage inner code decoder 13 to the second stage outer code decoder 14 represents that the rows PO1, PO2, and PO3 are "not updated", "not updated", and "updated", respectively, because the number of error symbols on the column PO1 was not decreased, the error symbols A and F on the column PO2 were corrected at step 1 and step 2, respectively, and the number of error symbols on the column PO3 was decreased.

Figure 10E:
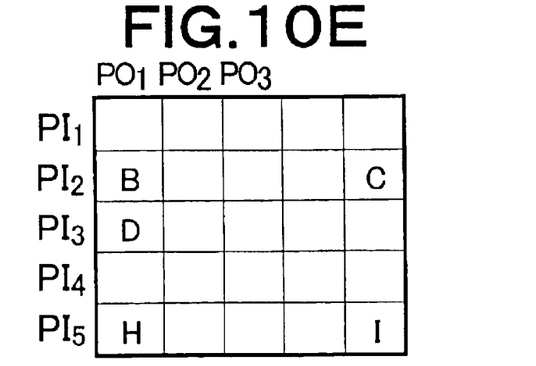

Step S4: The second stage outer code decoder 14 references the update flag UDO received from the second stage inner code decoder 13. Since the update flag UDO represents that the columns PO1 and PO2 are "not updated", the second stage outer code decoder 14 skips the error correcting process for error symbols on these columns. In contrast, the outer code decoder according to the related art reference skips the error correcting process for error symbols on only the column PO2. In other words, the number of columns that are skipped by the outer code decoder according to the present invention is two, whereas the number of columns which are skipped by the outer code decoder according to the present invention is one. The result of the error correcting process is output as error corrected data DO2.

In other words, the number of rows and columns which are skipped in the error correcting process according to the related art reference is two, whereas the number of rows and columns which are skipped in the error correcting process according to the present invention is six. Thus, according to the present invention, the calculation amount is remarkably decreased. According to the present embodiment, a case where the number of iterative times is two was described. However, likewise, the present invention can apply to cases where the number of iterative times is three or higher.

(Second Embodiment)

Next, a second embodiment of the present invention will be described. The first embodiment was directed to a product code decoding circuit. However, it is apparent that the present invention can be applied to a concatenated code, which is an upper concept of a product code. In other words, since a concatenated code has a structure for which decoding processes for two different codes are alternately and iteratively performed like a product code. Thus, the product code decoding circuit shown in FIG. 7 and FIG. 8 can be directly applied for a concatenated code.

(Third Embodiment)

Next, a third embodiment of the present invention will be described. The present invention can be applied to a decoding circuit for digital data composed of a concatenated code or a product code. For example, the present invention can be applied to a decoding circuit for received data for use with a wired communication system in which terminals are connected with a copper line or an optical fiber line. In addition, the present invention can be applied to a decoding circuit for received data for use with a wireless communication system in which portable terminals are wirelessly connected. Moreover, the present invention can be applied to a decoding circuit for data recorded on a recording medium such as a Compact Disc (CD), a Digital Versatile Disc (DVD), or the like.

(Fourth Embodiment)

Next, a fourth embodiment of the present invention will be described. The fourth embodiment is directed to a program which causes a computer to execute the decoding method according to the present invention. The recording medium 40 shown in FIG. 7 stores a program which causes the computer to execute at least the decoding method (error correcting process), namely, steps S1 to S4 shown in FIG. 9. Referring to FIG. 7, the controller 20 reads the program from the recording medium 40 and stores the program to the storing circuit 50. The controller 20 controls the error correcting circuit 10 and the correction status storing circuit 30 in accordance with the program stored in the storing circuit 50. Since the detail of the control has been described, its description will be omitted.

In the foregoing first to fourth embodiments, after an inner code is corrected, an outer code is corrected. However, it should be noted that the present invention is not limited to that. According to the present invention, after an outer code is corrected, an inner code may be corrected.

Although the present invention has been shown and described with respect to the best mode embodiment thereof, it should be understood by those skilled in the art that the foregoing and various other changes, omissions, and additions in the form and detail thereof may be made therein without departing from the spirit and scope of the present invention.

What is claimed is:

1. An iterative decoding method for decoding a concatenated code or a product code comprising a plurality of inner code words arranged in row or column direction and a plurality of outer words arranged in column or row direction, said method comprising the steps of:

performing a first error correction process for a plurality of first code words;

performing a second error correction process for a plurality of second code words; and performing a third error correction process for one or more first code words whose number of errors has been decreased by the second error correction process and skipping the third error correction process for one or more first code words whose number of errors has not been decreased by the second error correcting process.

2. The iterative decoding method as set forth in claim 1, further comprising:

performing a fourth error correction process for one or more second code words whose number of errors has been decreased by the third error correction process and skipping the fourth error correction process for one or more second code words whose number of errors has not been decreased by the third error correcting process.

3. The iterative decoding method as set forth in claim 1, wherein the first code words are inner code words, and wherein the second code words are outer code words.

4. The iterative decoding method as set forth in claim 1, wherein the first code words are outer code words, and wherein the second code words are inner code words.

5. An iterative decoding apparatus for decoding a concatenated code or a product code comprising a plurality of inner code words arranged in row or column direction and a plurality of outer words arranged in column or row direction, said apparatus comprising:

means for performing a first error correction process for a plurality of first code words;

means for performing a second error correction process for a plurality of second code words; and means for performing a third error correction process for one or more first code words whose number of errors has been decreased by the second error correction process and skipping the third error correction process for one or more first code words whose number of errors has not been decreased by the second error correcting process.

6. The iterative decoding apparatus as set forth in claim 5, further comprising:

means for performing a fourth error correction process for one or more second code words whose number of errors has been decreased by the third error correction process and skipping the fourth error correction process for one or more second code words whose number of errors has not been decreased by the third error correcting process.

7. The iterative decoding apparatus as set forth in claim 5, wherein the first code words are inner code words, and wherein the second code words are outer code words.

8. The iterative decoding apparatus as set forth in claim 5, wherein the first code words are outer code words, and wherein the second code words are inner code words.

9. A computer program product embodied on a computer-readable medium and comprising codes that, when executed, cause a computer to perform an iterative decoding method for decoding concatenated code or a product code comprising a plurality of inner code words arranged in row or column direction and a plurality of outer code words arranged in column or row direction, method comprising the steps of:

performing a first error correction process for a plurality of first code words;

performing a second error correction process for a plurality of second code words; and performing a third error correction process for one or more first code words whose number of errors has been decreased by the second error correction process and skipping the third error correction process for one or more first code words whose number of errors has not been decreased by the second error correcting process.

10. The computer program product as set forth in claim 9, wherein said method further comprises:

performing a fourth error correction process for one or more second code words whose number of errors has been decreased by the third error correction process and skipping the fourth error correction process for one or more second code words whose number of errors has not been decreased by the third error correcting process.

11. The computer program product as set forth in claim 9, wherein the first code words are inner code words, and wherein the second code words are outer code words.

12. The computer program product as set forth in claim 9, wherein the first code words are outer code words, and wherein the second code words are inner code words.

* * * * *